United States Patent [19]

Higuchi et al.

[11] Patent Number: 5,160,988
[45] Date of Patent: Nov. 3, 1992

[54] SEMICONDUCTOR DEVICE WITH COMPOSITE SURFACE INSULATOR

[75] Inventors: Takayoshi Higuchi, Sendai; Souichi Sugiura, Yokohama, both of Japan

[73] Assignee: Kabushiki Kaisha Toshiba, Kawasaki, Japan

[21] Appl. No.: 657,934

[22] Filed: Feb. 25, 1991

Related U.S. Application Data

[63] Continuation of Ser. No. 388,035, Aug. 1, 1989, abandoned.

[30] Foreign Application Priority Data

Aug. 3, 1988 [JP] Japan .................. 63-193865

[51] Int. Cl.[5] ................ H01L 29/68; H01L 27/02; H01L 29/34
[52] U.S. Cl. .................... 257/301; 257/640
[58] Field of Search ............ 357/23.6, 51, 54; 437/52, 919; 148/DIG. 163

[56] References Cited

U.S. PATENT DOCUMENTS

| | | | |
|---|---|---|---|
| 4,335,505 | 6/1982 | Shibata et al. | 357/54 |
| 4,542,481 | 9/1985 | Lange | 357/23.6 |
| 4,672,410 | 6/1987 | Miura et al. | 357/23.6 G |
| 4,704,368 | 11/1987 | Goth et al. | 437/919 |
| 4,713,678 | 12/1987 | Womack et al. | 357/23.6 G |
| 4,717,942 | 1/1988 | Nakamura et al. | 357/23.6 G |

FOREIGN PATENT DOCUMENTS

| | | | |
|---|---|---|---|
| 59-25265 | 2/1984 | Japan | 357/23.6 |
| 61-6857 | 1/1986 | Japan | 357/23.6 |

OTHER PUBLICATIONS

Terman, L. M., "Aluminum-Silicon Self-Aligned Gate 1-Device with Narrow Word Line Pitch" IBM Technical Disclosure Bulletin, vol. 15 No. 4 (Sep. 1972) pp. 1163-1164.

*Primary Examiner*—Rolf Hille
*Assistant Examiner*—Robert Limanek
*Attorney, Agent, or Firm*—Finnegan, Henderson, Farabow, Garrett & Dunner

[57] ABSTRACT

A semiconductor device comprises a substrate, first insulation layers formed on the substrate, and a second insulation layer formed on the substrate. The second insulation layer, which acts as a dielectric material of a capacitor component of the semiconductor device, is thinner than each of the first insulation layers.

10 Claims, 3 Drawing Sheets

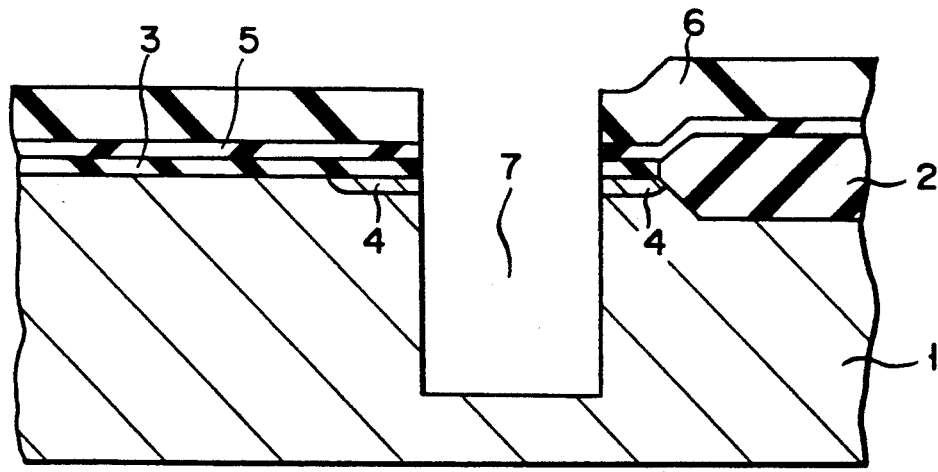
F I G. 1A
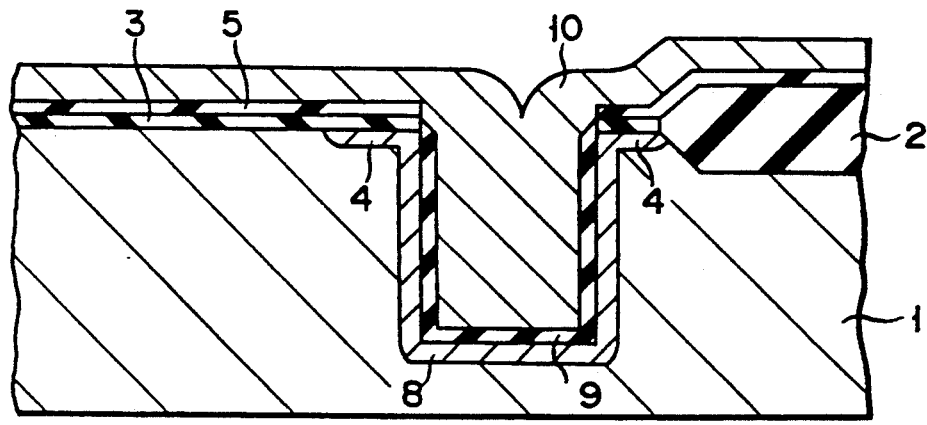
F I G. 1B
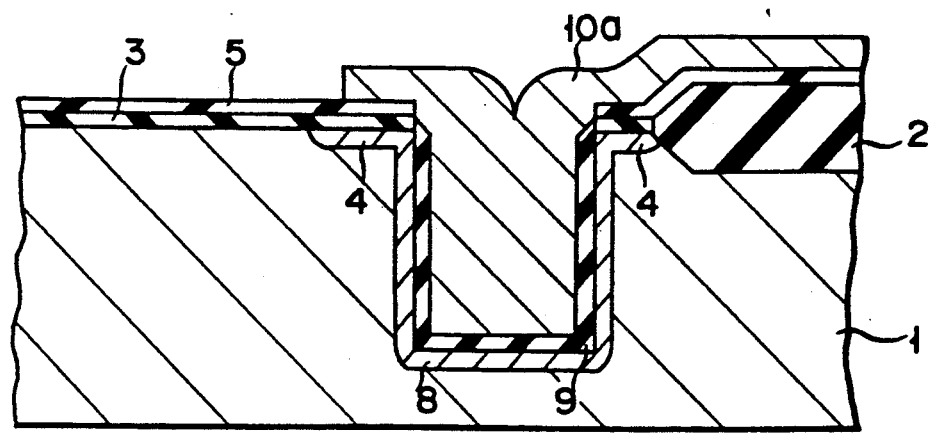
F I G. 1C

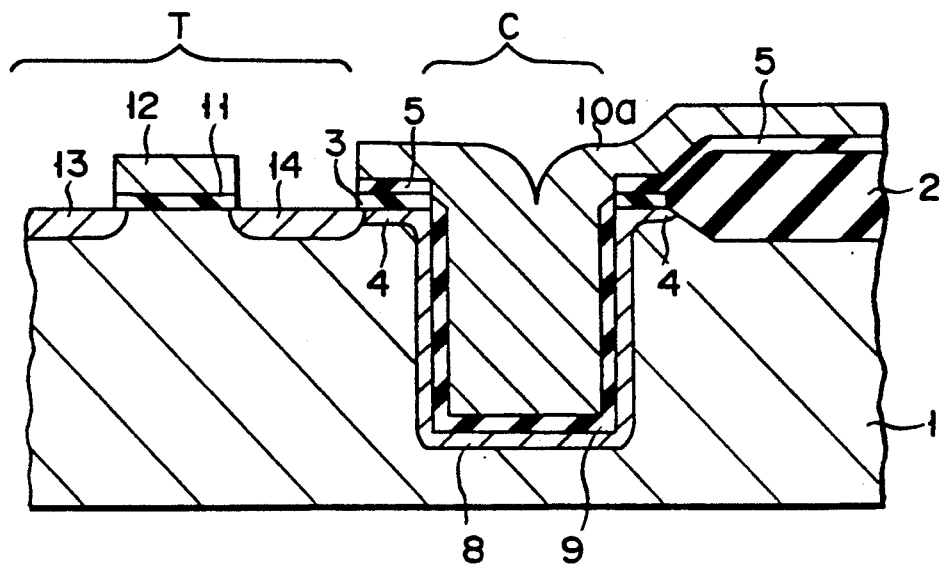
F I G. 1D
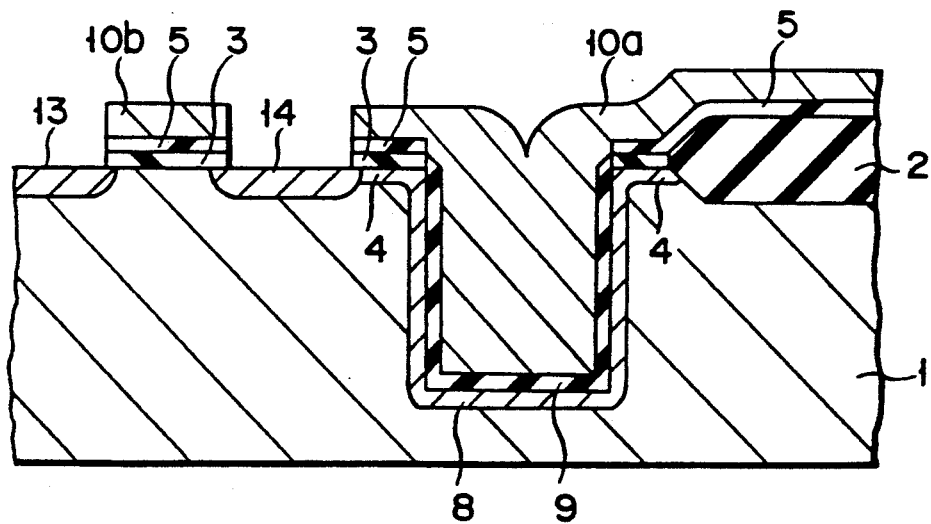
F I G. 2

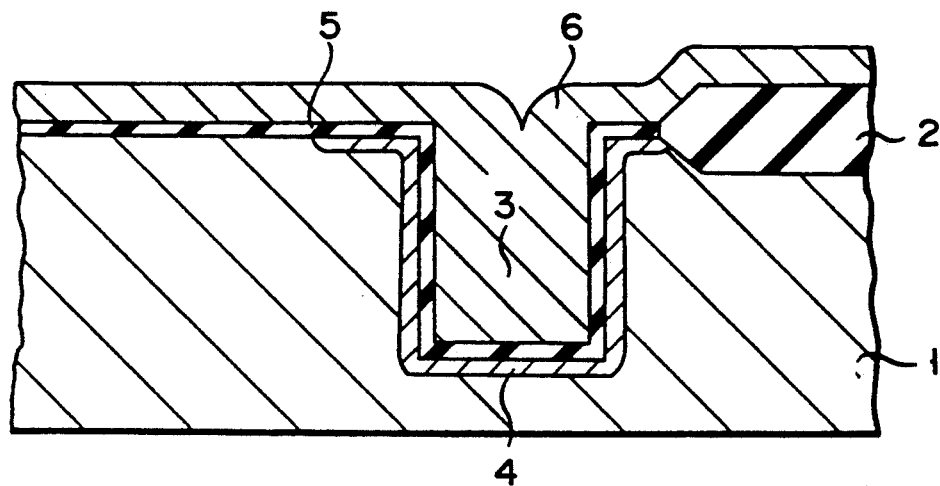
F I G. 3A
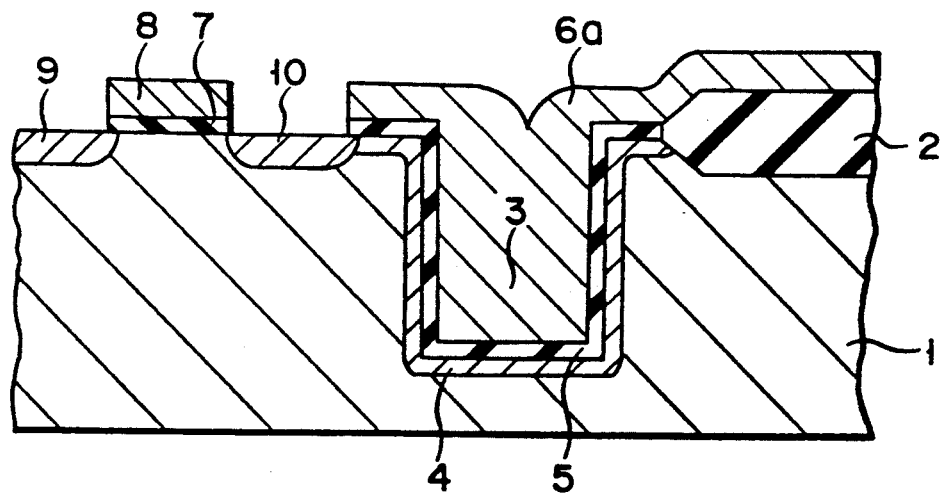
F I G. 3B

SEMICONDUCTOR DEVICE WITH COMPOSITE SURFACE INSULATOR

This application is a continuation of application Ser. No. 07/388,035, filed Aug. 1, 1989, now abandoned.

BACKGROUND OF THE INVENTION

1. Field of the Invention

The present invention relates to a semiconductor device and a method of producing the same, particularly, to a method of producing a dynamic RAM having a capacitor of a grooved structure.

2. Description of the Related Art

FIGS. 3A and 3B show a process of producing a semiconductor device in which the technical idea of the present invention is not employed. In the first step, a field oxide film 2 is selectively formed on the main surface of, for example, a p-type silicon substrate 1, as shown in FIG. 3A. Then, a CVD-SiO$_2$ film is formed on the entire surface, followed by patterning the silicon dioxide film and subsequently etching the silicon substrate 1 using the patterned silicon dioxide film as a mask so as to form a groove 3. After formation of the groove 3, the patterned silicon dioxide film is removed, followed by forming a capacitor oxide film 5 to cover the surface of the silicon substrate within the groove 3, and the main surface of the silicon substrate 1. The capacitor oxide film 5 is formed in a thickness of about 200 Å. Then, a polycrystalline silicon film 6, which is patterned later to form an electrode, is formed on the capacitor oxide film 5 in a thickness of about 4,000 Å/

In the next step, the polycrystalline silicon film 6 is selectively removed by reactive ion etching (RIE) to form a capacitor electrode 6a, as shown in FIG. 3B. The etching time in this step should be about 30% longer than required for removing a polycrystalline silicon film having a thickness of 4,000 Å such that the polycrystalline silicon film 6 should not be left unremoved in the etched portion. Then, the capacitor oxide film 5 is removed in the region where a transfer transistor is to be formed so as to expose the silicon substrate 1 to the outside, followed by forming a gate oxide film 7 and a transfer gate electrode 8 on the exposed surface in succession. Further, a drain region 9 and a source region 10 each consisting of an n$^+$-type diffusion layer are formed in the silicon substrate 1 such that the transfer gate electrode 8 is sandwiched between these source and drain regions in the lateral direction.

In a dynamic RAM of the construction described above, it is desirable for the capacitor to have a capacitance as large as possible in order to prevent, for example, a soft error. However, it has become difficult recently to ensure a large capacitance in accordance with the progress in the degree of integration of the semiconductor elements.

In order to increase the capacitance of the capacitor, it is necessary to make the groove 3 deeper or to make the capacitor oxide film 5 thinner. What should be noted, however, is that new problems are brought about, if the groove 3 is made deeper. For example, washing is made difficult, if the groove is made deeper. Naturally, the depth of the groove is limited. A new problem is also brought about in the case of making the capacitor oxide film 5 thinner. To be more specific, the capacitor oxide film 5 below the polycrystalline silicon film 6 is also thinned in the region other than the capacitor region, with the result that, in the etching step for forming the capacitor electrode, the silicon substrate 1 which should not be etched is also etched partly in addition to the oxide film 5 so as to do damage to the semiconductor substrate. It follows that deterioration takes place in the characteristics of the transfer transistor formed on the silicon substrate 1.

SUMMARY OF THE INVENTION

An object of the present invention is to provide a semiconductor memory device capable of making the capacitor oxide film thinner without doing damage to the semiconductor substrate so as to ensure a large capacitance and a method of producing the same.

According to the present invention, there is provided a semiconductor device, comprising a semiconductor substrate 1, first insulation layers 3 and 5 formed on the semiconductor substrate 1, and a second insulation layer 9 acting as a dielectric material included in a capacitor, said second insulation layer 9 being formed on the semiconductor substrate 1 and having a thickness smaller than that of the first insulation layers 3 and 5.

In the semiconductor device of the construction described above, a conductor layer T is patterned, with the semiconductor substrate protected by the first insulation layers 3 and 5 thicker than the second insulation layer 9 acting as a capacitor oxide film. It follows that the semiconductor substrate 1 is not damaged even if the second insulation layer 9 acting as a capacitor oxide film is formed thin.

BRIEF DESCRIPTION OF THE DRAWINGS

FIGS. 1A through 1D are cross sectional views collectively showing the manufacturing steps of a semiconductor memory device according to one embodiment of the present invention;

FIG. 2 is a cross sectional view showing another embodiment of the present invention; and FIGS. 3A and 3B are cross sectional views collectively showing the manufacturing steps of a semiconductor memory device without employing the technical idea of the present invention.

DETAILED DESCRIPTION OF THE PREFERRED EMBODIMENT

FIGS. 1A through 1D show how to produce a dynamic RAM having a thin capacitor as an example of the semiconductor memory device of the present invention. In the first step, a field oxide film 2 is formed on a p-type silicon substrate 1 so as to form element regions partitioned by the field oxide film 2, as shown in FIG. 1A. Then, an impurity layer 4 is selectively formed in the surface region of the silicon substrate 1 in the element region. In the next step, a silicon nitride film 5 having thickness of 100 Å and a CVD-SiO$_2$ film 6 having a thickness of 5,000 Å are deposited in succession to cover the entire surface, followed by selectively removing the CVD-SiO$_2$ film 6, the silicon nitride film 5 and the thermal oxide film 3 in the order mentioned by RIE using a patterned photoresist film (not shown) as a mask. Further, the silicon substrate 1 is etched by using the CVD-SiO$_2$ film 6 as a mask so as to form a groove 7 whose opening portion is positioned within the n$^+$-type impurity layer 4.

The remaining CVD-SiO$_2$ film 6 is then removed, followed by forming an n-type impurity layer 8 in the silicon substrate 1 along the wall defining the groove 7, as shown in FIG. 1B. Further, the exposed surface of the substrate 1 within the groove 7 is selectively oxidized so as to form a capacitor oxide film 9 having a thickness of about 70 Å on the surface of the substrate within the groove 7. After formation of the capacitor oxide film 9, a polycrystalline silicon layer 10 is formed on the entire surface, followed by forming a photoresist layer (not shown) on the polycrystalline silicon layer. The photoresist layer is then patterned to form a resist pattern (not shown). Then, the polycrystalline silicon layer 10 is selectively removed by RIE using the resist pattern as a mask so as to form a capacitor electrode 10a, as shown in FIG. 1C. It should be noted that the silicon nitride film 5 and the thermal oxide film 3 are sufficiently thicker than the capacitor oxide film 9. It follows that the capacitor oxide film 9 is not removed in the step of patterning the capacitor electrode 10a, with the result that it is possible to suppress the damage done to the silicon substrate 1.

In the next step, the silicon nitride film 5 and the thermal oxide film 3 remaining in the region in which a transfer transistor is to be formed are removed, followed by thermally oxidizing the exposed surface of the silicon substrate 1 so as to form a gate oxide film 11 having a thickness of 200 Å, as shown in FIG. 1D. After formation of the gate oxide film, a polycrystalline silicon layer is formed on the entire surface, followed by forming a resist pattern (not shown) on the polycrystalline silicon layer. Then, the polycrystalline silicon layer is selectively etched by RIE using the resist pattern as a mask so as to form a gate electrode 12. In this step, no damage is done to the silicon substrate 1 because the gate oxide film 11 is sufficiently thicker than the capacitor oxide film 9. After formation of the gate electrode 12, impurity ions are selectively implanted into the substrate surface region and, then, annealing is applied to the impurity-implanted regions so as to form an n+-type drain region 13 and an n+-type source region 14. As seen from the drawing, the source region 14 is connected to the n+-type impurity layer 8 acting as one electrode of the memory cell capacitor via the n+-type impurity layer 4.

Further, a CVD-SiO$_2$ film formed over the entire surface, and a contact hole is formed in the CVD-SiO$_2$ film (not shown), followed by forming an aluminum film on the silicon dioxide film. The aluminum film is patterned to form a bit line, which is electrically connected to the drain region 13 via the contact hole. The writing and reading of information to and from the memory cell capacitor C thus formed can be controlled effectively.

In the method described above, it is possible to make the first insulation layers (i.e., the thermal oxide film 3 and the silicon nitride film 5) formed in the region of the transfer transistor T sufficiently thick. Thus, it is possible to suppress the damage done to the silicon substrate 1 in the step of forming the capacitor electrode 10a by patterning the polycrystalline silicon film 10. What should also be noted is that the thickness of the capacitor oxide film 9 can be determined as desired. In other words, the capacitor oxide film 9 can be made sufficiently thin so as to ensure a capacitor of a large capacitance.

In the embodiment described above, the capacitor oxide film 9 is formed by selective oxidation using the silicon nitride film 5 as a mask. Alternatively, it is possible to form the capacitor oxide film 9 by using the oxide film 3 in place of the nitride film 5 as a mask. Also, in the embodiment described above, the thermal oxide film 3 and the silicon nitride film 5 remaining in the region in which the transfer transistor was to be formed were removed after the step of patterning the capacitor oxide film 9, followed by newly forming the gate oxide film 11 and the gate electrode 12. However, it is also possible to leave the thermal oxide film 3 and the silicon nitride film 5 shown in FIG. 1B unremoved. In this case, these thermal oxide film and the silicon nitride film are used as gate electrode layers, and a gate electrode 10b is formed by patterning the polycrystalline silicon layer 10 positioned on the silicon nitride film 5 as shown in FIG. 2. In short, the capacitor electrode 10a and the gate electrode 10b are formed by patterning the same polycrystalline silicon layer 10.

As described above, the present invention produces prominent effects. Specifically, it is possible to form a thick insulation layer in the region for forming a transfer transistor, even if the capacitor oxide film is formed thin. As a result, it is possible to suppress the damage done to the silicon substrate in the step of forming a capacitor electrode by patterning a polycrystalline silicon layer. In addition, since the capacitor oxide film is formed thin, it is possible to ensure a capacitor of a large capacitance, making it possible to eliminate problems accompanying an increase in the degree of integration such as a soft error.

What is claimed is:

1. A semiconductor device, comprising:
   a substrate;
   a capacitor formed in said substrate and having first and second insulation layers and a conductive layer, said first insulation layer being on at least a portion of a surface of said substrate, including a peripheral portion of said capacitor, said second insulation layer being a dielectric material of said capacitor and having a thickness less than that of said first insulation layer, and the conductive layer being on the second insulation layer;
   drain and source layers in first and second portions of the substrate not covered by either said first insulation layer or said second insulation layer;
   a third insulation layer on a third portion of the substrate between the first and second portions of the substrate; and
   a gate layer on the third insulation layer;
   wherein said first insulation layer comprises a lower layer and an upper layer, said upper layer comprising a silicon nitride film.

2. The semiconductor device as claimed in claim 1, further comprising:
   a first conductive layer formed in the substrate and beneath the second insulation layer.

3. The semiconductor device as claimed in claim 1, further comprising:
   transistor components formed in a surface region of the substrate in the proximity of said capacitor.

4. The semiconductor device as claimed in claim 1, wherein said first insulation layer comprises a plurality of layers each having a thickness of at least 200 Å.

5. The semiconductor device as claimed in claim 1, wherein said second insulation layer has a thickness of at most 150 Å.

6. The semiconductor device as claimed in claim 1, wherein the lower layer of said first insulation layer comprises a thermal oxide film.

7. The semiconductor device as claimed in claim 1, further comprising:
   a first conductive layer formed in the substrate and beneath the second insulation layer.

8. The semiconductor device as claimed in claim 1, wherein the drain, source, and gate layers constitute components of a transistor in proximity of said capacitor.

9. The semiconductor device as claimed in claim 1, wherein each of said lower and upper layers of said first insulation layer has a thickness of at least 200 Å.

10. The semiconductor device as claimed in claim 1, wherein said second insulation layer has a thickness of at most 150 Å.

* * * * *